United States Patent
Wu et al.

(10) Patent No.: US 12,289,865 B2
(45) Date of Patent: Apr. 29, 2025

(54) TWO-PHASE IMMERSION-COOLING HEAT-DISSIPATION COMPOSITE STRUCTURE HAVING HIGH-POROSITY SOLID STRUCTURE AND HIGH-THERMAL-CONDUCTIVITY FINS

(71) Applicant: AMULAIRE THERMAL TECHNOLOGY, INC., New Taipei (TW)

(72) Inventors: Chun-Te Wu, New Taipei (TW); Ching-Ming Yang, New Taipei (TW); Yu-Wei Chiu, New Taipei (TW); Tze-Yang Yeh, New Taipei (TW)

(73) Assignee: AMULAIRE THERMAL TECHNOLOGY, INC., New Taipei (TW)

( * ) Notice: Subject to any disclaimer, the term of this patent is extended or adjusted under 35 U.S.C. 154(b) by 270 days.

(21) Appl. No.: 17/981,182

(22) Filed: Nov. 4, 2022

(65) Prior Publication Data
US 2024/0155808 A1    May 9, 2024

(51) Int. Cl.
*H05K 7/20*    (2006.01)
*F28F 13/00*    (2006.01)
(Continued)

(52) U.S. Cl.
CPC ....... *H05K 7/2039* (2013.01); *H01L 23/3733* (2013.01); *H01L 23/3736* (2013.01);
(Continued)

(58) Field of Classification Search
CPC ..... F28F 13/003; H05K 7/2039; H05K 7/203; H01L 23/3733; H01L 23/3736; H01L 23/427; H01L 23/44
See application file for complete search history.

(56) References Cited

U.S. PATENT DOCUMENTS 3,127,668 A  *  4/1964  Troy .................... D04H 1/4234
                                              428/605
3,289,756 A  *  12/1966  Jaeger .................. F28F 13/003
                                              29/890.036
(Continued)

FOREIGN PATENT DOCUMENTS

AT          408153 B   *  7/2001   ........... C22C 1/1036
BE        1023686 B1  *  6/2017
(Continued)

*Primary Examiner* — Ljiljana V. Ciric
(74) *Attorney, Agent, or Firm* — Li & Cai Intellectual Property (USA) Office

(57) ABSTRACT

A two-phase immersion-cooling heat-dissipation composite structure. The heat-dissipation composite structure includes a heat dissipation base, a plurality of high-thermal-conductivity fins, and at least one high-porosity solid structure. The heat dissipation base has a first surface and a second surface that face away from each other. The second surface of the heat dissipation base is in contact with a heating element immersed in a two-phase coolant. The first surface of the heat dissipation base is connected to the high-thermal-conductivity fins. The at least one high-porosity solid structure is located at the first surface of the heat dissipation base, and is connected and alternately arranged between side walls of two adjacent ones of the high-thermal-conductivity fins. Each of the high-porosity solid structure includes a plurality of closed holes and a plurality of open holes.

10 Claims, 3 Drawing Sheets

(51) Int. Cl.
*H01L 23/373* (2006.01)
*H01L 23/427* (2006.01)
*H01L 23/44* (2006.01)

(52) U.S. Cl.
CPC ............ *H01L 23/427* (2013.01); *H01L 23/44* (2013.01); *H05K 7/203* (2013.01); *F28F 13/003* (2013.01)

(56) References Cited

U.S. PATENT DOCUMENTS

| | | | | |
|---|---|---|---|---|
| 3,331,435 A * | 7/1967 | Valyi | .................... | F28F 13/003 62/515 |
| 3,394,447 A * | 7/1968 | Valyi | .................... | B23P 15/26 29/4 |
| 3,439,739 A * | 4/1969 | Jaeger | .................... | F28D 7/106 165/DIG. 400 |
| 3,490,718 A * | 1/1970 | Vary | .................... | B64G 1/503 165/47 |
| 3,680,189 A * | 8/1972 | Noren | .................... | F28D 15/0283 29/890.032 |
| 4,047,198 A * | 9/1977 | Sekhon | .................... | F28D 15/0233 257/713 |
| 4,222,434 A * | 9/1980 | Clyde | .................... | F28F 9/22 165/181 |
| 4,233,645 A * | 11/1980 | Balderes | .................... | H01L 23/4338 361/698 |
| 4,285,385 A * | 8/1981 | Hayashi | .................... | B22D 25/005 164/112 |
| 4,312,012 A * | 1/1982 | Frieser | .................... | H01L 23/427 257/713 |
| 4,381,818 A * | 5/1983 | Sachar | .................... | C23C 14/165 257/722 |
| 4,531,146 A * | 7/1985 | Cutchaw | .................... | H01L 23/433 361/689 |
| 4,730,665 A * | 3/1988 | Cutchaw | .................... | H01L 23/473 257/E23.09 |
| 4,884,169 A * | 11/1989 | Cutchaw | .................... | H01L 23/427 257/713 |
| 4,903,389 A * | 2/1990 | Wolf | .................... | F28F 9/001 165/175 |
| 4,993,487 A * | 2/1991 | Niggemann | .................... | F25B 39/00 165/DIG. 360 |
| 5,123,982 A * | 6/1992 | Kuzay | .................... | G02B 7/1815 165/80.1 |
| 5,125,451 A * | 6/1992 | Matthews | .................... | H01L 23/473 257/E23.098 |
| 5,832,981 A * | 11/1998 | McDonald | .................... | B22C 7/023 164/36 |
| 5,847,927 A * | 12/1998 | Minning | .................... | F28F 13/003 361/708 |
| 5,960,861 A * | 10/1999 | Price | .................... | F28F 13/003 165/170 |
| 6,062,302 A * | 5/2000 | Davis | .................... | F28D 15/046 165/185 |
| 6,073,688 A * | 6/2000 | Kato | .................... | F28F 9/0224 165/173 |
| 6,302,192 B1 * | 10/2001 | Dussinger | .................... | F28D 15/0233 165/104.21 |
| 6,725,909 B1 * | 4/2004 | Luo | .................... | F28F 1/24 174/15.2 |
| 6,840,307 B2 * | 1/2005 | Eesley | .................... | H01L 23/3677 165/905 |
| 6,874,568 B2 * | 4/2005 | Lai | .................... | H01L 23/4006 165/80.4 |
| 6,880,626 B2 * | 4/2005 | Lindemuth | .................... | F28D 15/0233 174/15.2 |
| 6,896,039 B2 * | 5/2005 | Dussinger | .................... | F28D 15/046 165/104.21 |
| 6,945,317 B2 * | 9/2005 | Garner | .................... | F28D 15/046 29/890.032 |
| 6,994,152 B2 * | 2/2006 | Rosenfeld | .................... | B22F 3/1103 165/104.21 |
| 6,997,245 B2 * | 2/2006 | Lindemuth | .................... | F28D 15/046 165/104.21 |
| 7,013,958 B2 * | 3/2006 | Garner | .................... | F28D 15/0233 174/15.2 |
| 7,028,759 B2 * | 4/2006 | Rosenfeld | .................... | F28D 15/046 165/104.21 |
| 7,028,760 B2 * | 4/2006 | Dussinger | .................... | H01L 23/4006 165/104.21 |
| 7,100,679 B2 * | 9/2006 | Dussinger | .................... | F28D 15/046 165/104.21 |
| 7,100,680 B2 * | 9/2006 | Dussinger | .................... | H01L 23/427 165/83 |
| 7,124,809 B2 * | 10/2006 | Rosenfeld | .................... | F28D 15/046 165/104.21 |
| 7,363,962 B2 * | 4/2008 | Cleland | .................... | B67D 1/0862 165/47 |
| 7,420,810 B2 * | 9/2008 | Reis | .................... | F28F 3/02 257/713 |
| 7,422,053 B2 * | 9/2008 | Siu | .................... | F28F 3/02 165/104.33 |
| 7,650,931 B2 * | 1/2010 | Siu | .................... | F28D 15/0233 29/890.032 |
| 7,658,005 B2 * | 2/2010 | Sulzer | .................... | F24D 3/142 165/47 |
| 8,215,372 B2 * | 7/2012 | Anglin | .................... | F28F 21/084 164/369 |
| 8,250,874 B2 * | 8/2012 | Ikegami | .................... | F25B 13/00 62/509 |
| 8,397,796 B2 * | 3/2013 | Thayer | .................... | F28F 13/003 165/80.4 |
| 8,579,014 B2 * | 11/2013 | Kauppila | .................... | F27D 3/08 432/15 |
| 8,953,317 B2 * | 2/2015 | Campbell | .................... | F28D 1/0477 361/689 |
| 9,664,459 B2 * | 5/2017 | Wilding | .................... | F28F 9/02 |
| 9,700,930 B2 * | 7/2017 | Yang | .................... | F28D 15/04 |
| 9,803,938 B2 * | 10/2017 | Joshi | .................... | H01L 23/4735 |
| 9,976,820 B2 * | 5/2018 | Okazaki | .................... | F28D 1/05383 |
| 10,006,720 B2 * | 6/2018 | Bhunia | .................... | H01L 23/3675 |
| 10,006,723 B2 * | 6/2018 | Okubo | .................... | F16L 25/0009 |
| 10,096,537 B1 * | 10/2018 | Chen | .................... | F28D 15/0266 |
| 10,107,570 B2 * | 10/2018 | Matsuda | .................... | F16L 41/02 |
| 10,288,363 B2 * | 5/2019 | Matsui | .................... | F25B 39/022 |
| 11,015,879 B2 * | 5/2021 | Cai | .................... | F28F 3/048 |
| 11,022,383 B2 * | 6/2021 | Cai | .................... | F28D 15/046 |
| 11,096,313 B2 * | 8/2021 | Amos | .................... | H05K 7/20263 |
| 11,167,375 B2 * | 11/2021 | Schiffres | .................... | B22F 10/28 |
| 11,421,947 B2 * | 8/2022 | Matsui | .................... | F25B 39/04 |
| 11,426,818 B2 * | 8/2022 | Schiffres | .................... | B33Y 80/00 |
| 11,632,996 B2 * | 4/2023 | Schlam | .................... | A61F 7/00 427/331 |
| 12,048,119 B2 * | 7/2024 | Chen | .................... | H05K 7/20809 |
| 12,120,849 B2 * | 10/2024 | Balachandar | .................... | H05K 7/2039 |
| 12,150,276 B2 * | 11/2024 | Wang | .................... | H05K 7/20318 |
| 12,156,376 B2 * | 11/2024 | Yang | .................... | H05K 7/2039 |
| 2002/0179284 A1 * | 12/2002 | Joshi | .................... | F28D 15/0233 165/104.33 |
| 2002/0186538 A1 * | 12/2002 | Kase | .................... | H01L 23/473 361/689 |
| 2003/0116308 A1 * | 6/2003 | Watanabe | .................... | F28F 9/0212 165/174 |
| 2004/0182544 A1 * | 9/2004 | Lee | .................... | H01L 23/473 257/E23.098 |
| 2006/0196640 A1 * | 9/2006 | Siu | .................... | H01L 23/473 257/E23.103 |
| 2007/0230128 A1 * | 10/2007 | Kim | .................... | F28D 15/046 361/699 |
| 2010/0018678 A1 * | 1/2010 | Siu | .................... | F28D 15/0233 165/104.33 |
| 2011/0127013 A1 * | 6/2011 | Kawamura | .................... | H01L 23/427 29/890.032 |
| 2012/0198882 A1 * | 8/2012 | Takagi | .................... | F28F 1/128 62/524 |
| 2012/0328789 A1 * | 12/2012 | Lu | .................... | C25D 5/54 427/404 |
| 2015/0007965 A1 * | 1/2015 | Joshi | .................... | H01L 23/4735 165/185 |

(56) References Cited

U.S. PATENT DOCUMENTS

| | | | | |
|---|---|---|---|---|
| 2015/0109735 A1* | 4/2015 | Campbell | ............ | H05K 7/2079 361/700 |
| 2017/0290198 A1* | 10/2017 | Shepard | ............ | H05K 7/20881 |
| 2019/0360759 A1* | 11/2019 | Collins | ................ | H01L 23/473 |
| 2021/0307202 A1* | 9/2021 | Abate | .................... | B22F 10/20 |
| 2022/0055153 A1* | 2/2022 | Schiffres | ............... | F28F 21/081 |
| 2022/0161343 A1* | 5/2022 | Blain | ................ | H01L 23/3733 |
| 2023/0071418 A1* | 3/2023 | Hung | ................. | H01L 23/3672 |
| 2023/0085871 A1* | 3/2023 | Nakata | .................... | F25B 39/00 165/129 |
| 2023/0094694 A1* | 3/2023 | Nakata | ...................... | F28F 1/04 165/175 |
| 2023/0105760 A1* | 4/2023 | Moriuchi | ................ | C22C 49/14 165/185 |
| 2023/0108901 A1* | 4/2023 | Nakata | ................. | F28F 9/0265 165/175 |
| 2023/0121635 A1* | 4/2023 | Yang | .................. | H01L 23/3672 165/185 |
| 2023/0133342 A1* | 5/2023 | Oka | ........................ | F25B 39/04 165/177 |
| 2023/0152045 A1* | 5/2023 | Peng | ..................... | F28F 13/003 165/104.19 |
| 2023/0156866 A1* | 5/2023 | Peng | ........................ | H05B 3/06 165/80.4 |
| 2023/0200022 A1* | 6/2023 | Peng | ..................... | H05K 7/203 361/679.53 |
| 2023/0262931 A1* | 8/2023 | Peng | .................. | H05K 7/20309 361/679.46 |
| 2023/0266076 A1* | 8/2023 | Peng | .................. | H01L 23/3733 165/80.4 |
| 2023/0284417 A1* | 9/2023 | Chen | ....................... | F28F 21/04 |
| 2023/0288145 A1* | 9/2023 | Maema | ................ | F28F 9/0275 |
| 2023/0338948 A1* | 10/2023 | Ramakrishnan | .. | B01L 3/502715 |
| 2023/0341910 A1* | 10/2023 | Ramakrishnan | ....... | H05K 7/203 |
| 2023/0358451 A1* | 11/2023 | Takahashi | ............. | F28F 9/0278 |
| 2024/0040747 A1* | 2/2024 | Yang | ...................... | H05K 7/203 |
| 2024/0142180 A1* | 5/2024 | Yang | ...................... | F28D 15/02 |
| 2024/0142181 A1* | 5/2024 | Wu | ........................ | F28F 21/084 |
| 2024/0147662 A1* | 5/2024 | Yang | ...................... | H05K 7/203 |
| 2024/0155807 A1* | 5/2024 | Wu | ....................... | H01L 23/427 |
| 2024/0155808 A1* | 5/2024 | Wu | ...................... | H01L 23/3733 |
| 2024/0155809 A1* | 5/2024 | Wu | ...................... | H05K 7/2039 |
| 2024/0244797 A1* | 7/2024 | Wu | ......................... | H01L 23/44 |
| 2024/0251525 A1* | 7/2024 | Ide | ....................... | H05K 7/2029 |
| 2024/0255229 A1* | 8/2024 | Wang | ..................... | F28F 13/003 |
| 2024/0280332 A1* | 8/2024 | Chiu | ........................ | F28F 3/02 |
| 2025/0016959 A1* | 1/2025 | Wang | ................. | H05K 7/20809 |

FOREIGN PATENT DOCUMENTS

| | | | | |
|---|---|---|---|---|
| CA | 3166553 A1 | * | 8/2021 | ............. B22F 10/20 |
| CN | 110634816 B | * | 6/2021 | ........... H01L 23/367 |
| CN | 111095541 B | * | 12/2021 | ........... H01L 23/367 |
| CN | 115547949 A | * | 12/2022 | ......... H01L 23/3677 |
| EP | 0159722 B1 | * | 10/1985 | |
| EP | 3088833 A1 | * | 11/2016 | ............ F25B 13/00 |
| EP | 4119867 A1 | * | 1/2023 | ........... F25B 39/028 |
| EP | 4130368 A1 | * | 2/2023 | ................ B22F 3/12 |
| GB | 2024066 A | * | 1/1980 | .............. B22C 9/26 |
| JP | H05156385 A | * | 6/1993 | |
| JP | H10154781 A | * | 6/1998 | |
| JP | 2011112330 A | * | 6/2011 | ................ B22F 7/08 |
| JP | 2022177463 A | * | 12/2022 | ........ H01L 23/3733 |
| KR | 20220114006 A | * | 8/2022 | ........... H01L 23/367 |
| KR | 20220139934 A | * | 10/2022 | |
| KR | 102552852 B1 | * | 7/2023 | |
| KR | 102640723 B1 | * | 2/2024 | |
| WO | WO-0169159 A1 | * | 9/2001 | ........... F28F 13/003 |
| WO | WO-2006058494 A1 | * | 6/2006 | ........ F28D 15/0233 |
| WO | WO-2009131786 A2 | * | 10/2009 | ............. C23C 18/08 |
| WO | WO-2022030376 A1 | * | 2/2022 | .............. F25B 39/02 |

\* cited by examiner

TWO-PHASE IMMERSION-COOLING HEAT-DISSIPATION COMPOSITE STRUCTURE HAVING HIGH-POROSITY SOLID STRUCTURE AND HIGH-THERMAL-CONDUCTIVITY FINS

FIELD OF THE DISCLOSURE

The present disclosure relates to a heat dissipation structure, and more particularly to a two-phase immersion-cooling heat-dissipation composite structure having high-porosity solid structure and high-thermal-conductivity fins.

BACKGROUND OF THE DISCLOSURE

An immersion cooling technology is performed by directly immersing heating elements (such as servers and disk arrays) in a coolant that is non-conductive, so that heat generated by operations of the heating elements can be removed by an endothermic gasification process of the coolant. However, if the coolant is used with cooling fins, the cooling fins will lack nucleation sites for bubble generation. If the coolant is used with a porous structure, the nucleation sites for bubble generation are increased in number, but the disadvantage of heat conduction in the vertical direction will lead to thermal performance degradation. Therefore, how to dissipate heat more effectively through the immersion cooling technology has long been an issue to be addressed in the industry.

SUMMARY OF THE DISCLOSURE

In response to the above-referenced technical inadequacies, the present disclosure provides a two-phase immersion-cooling heat-dissipation composite structure having high-porosity solid structure and high-thermal-conductivity fins.

In one aspect, the present disclosure provides a two-phase immersion-cooling heat-dissipation composite structure having high-porosity solid structure and high-thermal-conductivity fins. The two-phase immersion-cooling heat-dissipation composite structure includes a heat dissipation base, a plurality of high-thermal-conductivity fins, and at least one high-porosity solid structure. The heat dissipation base has a first surface and a second surface that face away from each other, the second surface of the heat dissipation base is in contact with a heating element immersed in a two-phase coolant. The first surface of the heat dissipation base is connected to the plurality of high-thermal-conductivity fins. The at least one high-porosity solid structure is located at the first surface of the heat dissipation base, and the at least one high-porosity solid structure is alternately arranged and connected between side walls of any two adjacent ones of the plurality of high-thermal-conductivity fins. The high-porosity solid structure includes a plurality of closed holes and a plurality of open holes. A predetermined volume ratio of the high-porosity solid structure to the high-thermal-conductivity fins is higher than 0.25.

In certain embodiments, the high-thermal-conductivity fins are made of copper, copper alloy, aluminum, or aluminum alloy.

In certain embodiments, the high-thermal-conductivity fins are formed by bending, forging, extrusion, or powder sintering.

In certain embodiments, the high-thermal-conductivity fins are pin-fins or plate fins, and the thermal conductivity of the high-thermal-conductivity fins is greater than 300 W/m·K.

In certain embodiments, the predetermined volume ratio of the high-porosity solid structure to the high-thermal-conductivity fins is between 0.25 and 2.25.

In certain embodiments, a porosity of the high-porosity solid structure is higher than a porosity of the high-thermal-conductivity fins, and the porosity of the high-porosity solid structure is higher than 20% and less than 70%.

In certain embodiments, a height of the high-porosity solid structure is higher than 1 mm, and the height of the high-porosity solid structure is between 10% and 150% of a height of the high-thermal-conductivity fins.

In certain embodiments, the high-porosity solid structure is formed by metal powder sintering, and a metal powder for forming the high-porosity solid structure has a median diameter (D50) between 30 μm and 800 μm.

In certain embodiments, the high-porosity solid structures are formed by chemically etching a substrate with a chemical agent of phosphoric acid microetching solution, sulfate microetching solution, or ferric chloride etching solution.

In certain embodiments, the high-porosity solid structure is made of a substrate of copper, copper alloy, aluminum alloy, graphite, or silver.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
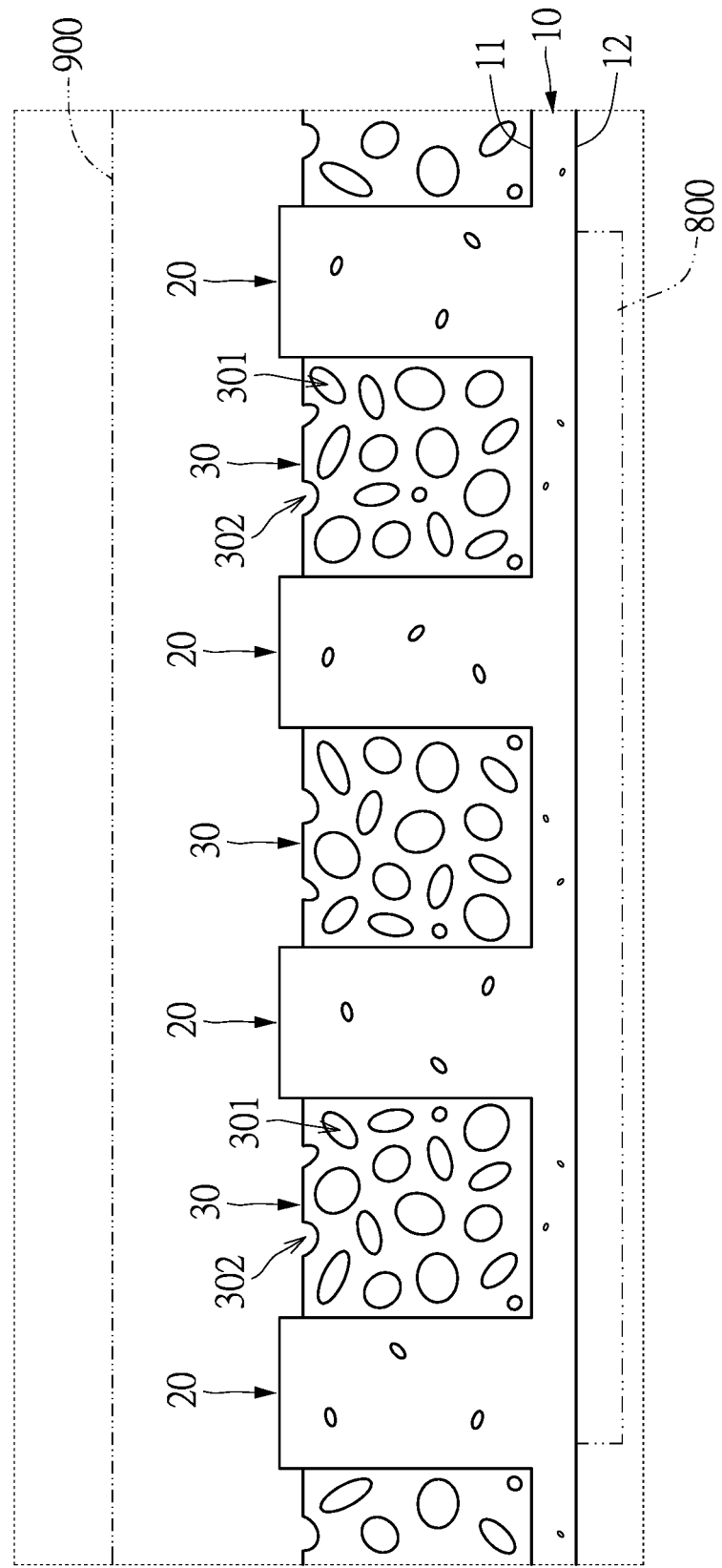
FIG. 1 is a schematic side view of a composite structure according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1, which shows an embodiment of the present disclosure. A two-phase immersion-cooling heat-dissipation composite structure having high-porosity solid structure and high-thermal-conductivity fins is provided in this embodiment of the present disclosure for contacting heat emitting elements (heat source) which is immersed in a two-phase coolant. As shown in FIG. 1, the two-phase immersion-cooling heat-dissipation composite structure having high-porosity solid structure and high-thermal-conductivity fins according to the present disclosure includes a heat dissipation base 10, a plurality of high-thermal-conductivity fins 20, and at least one high-porosity solid structure 30.

In the present embodiment, the heat dissipation base 10 can be made of a material having high thermal conductivity, such as copper, copper alloy, or aluminum alloy.

Furthermore, the heat dissipation base 10 can be plate-shaped and has a first surface 11 and a second surface 12 that face away from each other. The second surface 12 of the heat dissipation base 10 is in contact with a heating element 800 immersed in a two-phase coolant 900 (thermo-contact).

Moreover, the first surface 11 of the heat dissipation base 10 is connected to the plurality of high-thermal-conductivity fins 20, and the heat dissipation base 10 and the plurality of high-thermal-conductivity fins 20 can be integrally connected to one another by metal injection molding (MIM) or skiving, or be connected to one another by soldering. The high-thermal-conductivity fins 20 can be made of one of copper, copper alloy, aluminum, or aluminum alloy. The high-thermal-conductivity fins 20 can be formed by bending, forging, extrusion, or powder sintering. Furthermore, the high-thermal-conductivity fins 20 can be pin-fins or plate fins. The high-thermal-conductivity fins 20 preferably have a height of greater than 3 mm, and the thermal conductivity of the high-thermal-conductivity fins 20 is greater than 300 W/m·K. In addition, a porosity of the high-thermal-conductivity fins 20 is less than 15%. The high-thermal-conductivity fins 20 having porosity higher than 15% leads to low thermal conductivity and insufficient mechanical strength.

Therefore, to enhance immersion-cooling heat-dissipation effect, at least one high-porosity solid structure 30 is located at the first surface 11 of the heat dissipation base 10 and the at least one high-porosity solid structure 30 is connected between side walls of any two adjacent ones of the high-thermal-conductivity fins 20. That is, the at least one high-porosity solid structure 30 is filled in the gaps between the side walls of any two adjacent ones of the high-thermal-conductivity fins 20 and is alternately arranged between the side walls of any two adjacent ones of the high-thermal-conductivity fins 20. Further, a predetermined volume ratio of the high-porosity solid structure to the high-thermal-conductivity fins is higher than 0.25, and most preferably between 0.25 and 2.25. Moreover, a porosity of the high-porosity solid structure 30 needs to be higher than a porosity of the high-thermal-conductivity fins 20. Furthermore, the porosity of the high-porosity solid structure may be higher than 20%, and can be 70%. In addition, a height of the high-porosity solid structure 30 is preferably higher than 1 mm, and the height of the high-porosity solid structure 30 need to be between 10% and 150% of a height of the high-thermal-conductivity fins 20.

In the present embodiment, the high-porosity solid structure 30 may be, but is not limited to being, made of copper, copper alloy, aluminum alloy, graphite, or silver. A plurality of closed holes 301 and a plurality of open holes 302 are formed in the high-porosity solid structure 30. Further, the high-porosity solid structure 30 may be formed by chemical etching. That is, the high-porosity solid structure is formed by chemically etching a substrate with a chemical agent of phosphoric acid microetching solution, sulfate microetching solution, or ferric chloride etching solution.

Moreover, the high-porosity solid structure 30 may be formed by metal powder sintering. Furthermore, a metal powder for forming the high-porosity solid structure has a median diameter that is preferably between 30 μm and 800 μm, and a pore-making agent is added to the metal powder to ensure that the porosity of the high-porosity solid structure 30 can be more than 20%. Further, the closed holes 301 and the open holes 302 of the high-porosity solid structure 30 may be increased in number through chemical deposition, electroplating, or vapor deposition (physical or chemical vapor deposition).

Therefore, in the present embodiment, the thermal conductivity in a vertical direction and nucleation sites for bubbles can be simultaneously improved through the composite structure of high-thermal-conductivity fins and high-porosity solid structure, thereby effectively enhancing an overall immersion heat dissipation effect.

Second Embodiment

Figure 2:
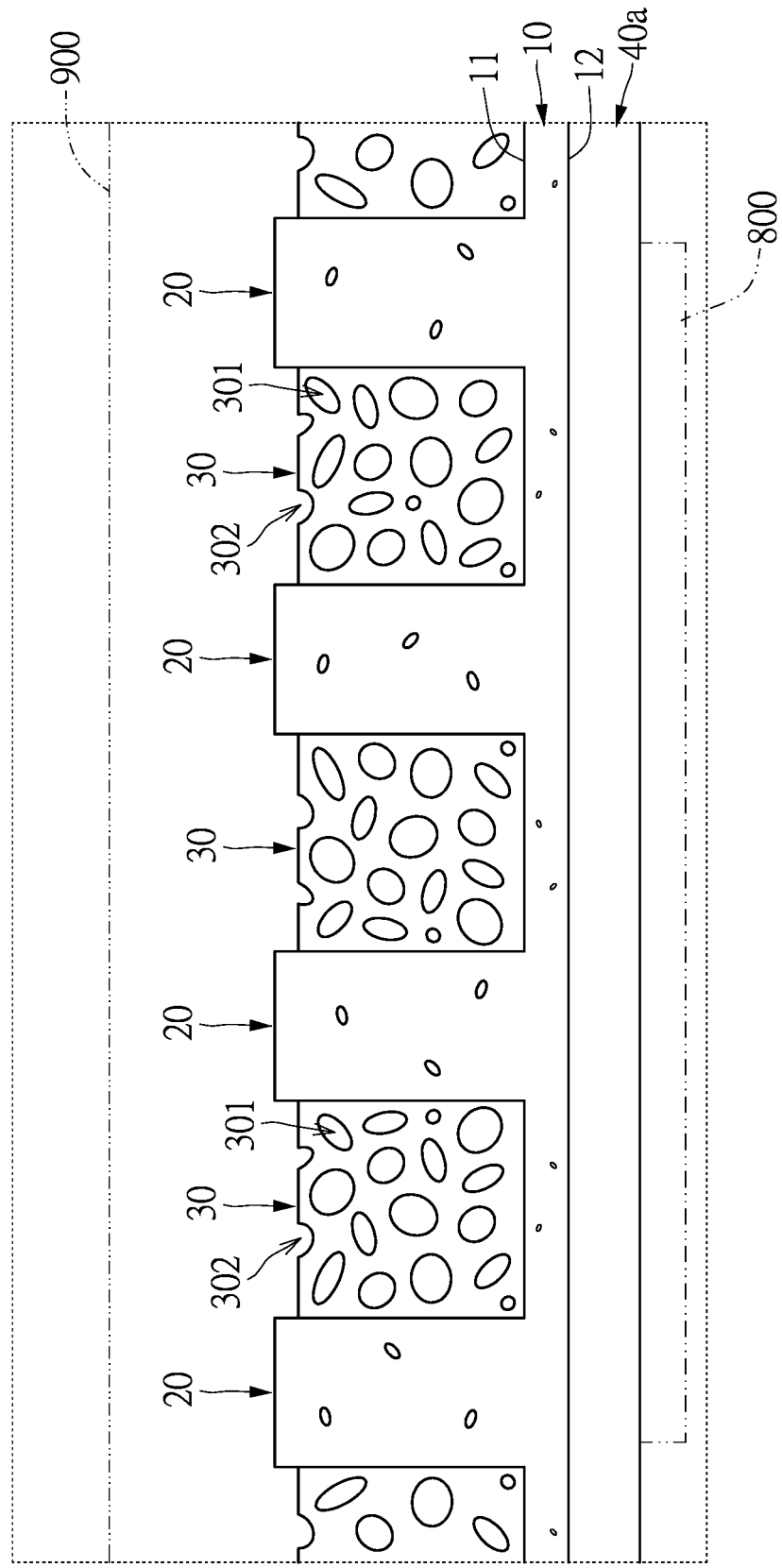
FIG. 2 is a schematic side view of a composite structure according to a second embodiment of the present disclosure.

Reference is made to FIG. 2, which shows a second embodiment of the present disclosure. This embodiment is substantially the same as the first embodiment, and differences therebetween are described as follows.

In the present embodiment, the composite structure further includes a highly thermally conductive structure 40a. Further, the highly thermally conductive structure 40a is a thermal conductivity structure having a thermal conductivity higher than 300 W/m·K. Further, the highly thermally conductive structure 40a is bonded to the second surface 12 of the heat dissipation base 10, so that the second surface 12 of the heat dissipation base 10 is in indirect contact with the heating element 800 immersed in a two-phase coolant 900 (thermo-contact). In detail, the highly thermally conductive structure 40a may be bonded to the second surface 12 of the heat dissipation base 10 by soldering, friction stir welding (FSW), adhesion, diffusion bonding, and the like.

In the present embodiment, the highly thermally conductive structure 40a may be a solid metal plate that is made of copper, copper alloy, or aluminum alloy. In addition, the highly thermally conductive structure 40a may be made of graphite that has high thermal conductivity.

Third Embodiment

Figure 3:
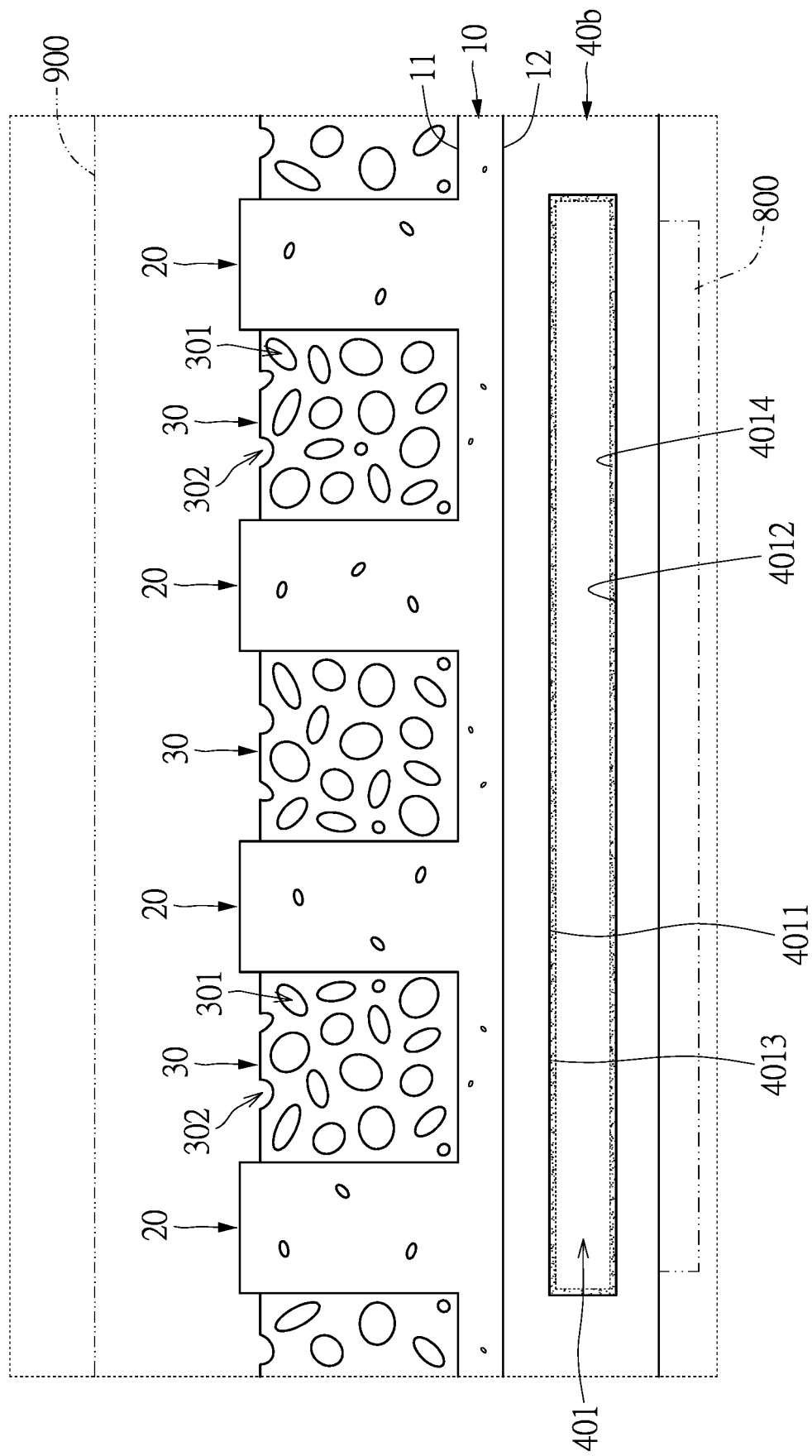
FIG. 3 is a schematic side view of a composite structure according to a third embodiment of the present disclosure.

Reference is made to FIG. 3, which shows a third embodiment of the present disclosure. This embodiment is substantially the same as the first embodiment and the second embodiment, and differences therebetween are described as follows.

In the present embodiment, an enclosed vacuum chamber 401 is formed in a highly thermally conductive structure 40b, and an upper sintered body 4013 and a lower sintered body 4014 are respectively formed on a top wall 4011 and bottom wall 4012 of the enclosed vacuum chamber 401. The enclosed vacuum chamber 401 contains appropriate amount of liquid therein, and the liquid may be water or acetone. Further, a bottom surface of the highly thermally conductive structure 40b can be in contact with the heating element 800 immersed in a two-phase coolant 900. The heat generated by the heating elements 800 can be removed by an endothermic gasification process of the coolant 900. Besides, the heat generated by the heating elements 800 can be absorbed through contacting with the highly thermally conductive structure 40b. The liquid in the enclosed vacuum chamber 401 is gasified or vaporized into vapor and then distributed to the heat dissipation base 10, and the heat is rapidly conducted to the high-thermal-conductivity fins 20 and the high-porosity solid structure 30 of the heat dissipation base 10. The heat absorbed by the high-thermal-conductivity fins 20 and the high-porosity solid structure 30 is then removed through the endothermic gasification process of the two-phase coolant 900. The vapor in the enclosed vacuum chamber 401 flows back to the bottom wall 4012 after transferring out the heat and being condensed at the top wall 4011. By performing the afore-mentioned loop at a high speed, heat generated by the heating element 800 can be rapidly delivered outward, thereby further improving the overall immersion-cooling heat-dissipation effect.

Beneficial Effects of the Embodiments

In conclusion, in the two-phase immersion-cooling heat-dissipation composite structure provided by the present disclosure, by virtue of "a heat dissipation base," "a plurality of high-thermal-conductivity fins," "at least one high-porosity solid structure," "the heat dissipation base having a first surface and a second surface opposite to each other, the second surface of the heat dissipation base being in contact with a heating element immersed in a two-phase coolant, and the first surface of the heat dissipation base being connected to the plurality of high-thermal-conductivity fins, " "the at least one high-porosity solid structure being located at the first surface of the heat dissipation base and the at least one high-porosity solid structure being connected and alternately arranged between side walls of any two adjacent ones of the plurality of high-thermal-conductivity fins," "the high-porosity solid structure including a plurality of closed holes and a plurality of open holes," and "a predetermined volume ratio of the high-porosity solid structure to the high-thermal-conductivity fins being higher than 0.25," an immersion-cooling heat-dissipation effect can be effectively enhanced.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A two-phase immersion-cooling heat-dissipation composite structure, comprising: a heat dissipation base, a plurality of high-thermal-conductivity fins, and at least one high-porosity solid structure; wherein the heat dissipation base has a first surface and a second surface that face away from each other, the second surface of the heat dissipation base is in contact with a heating element immersed in a two-phase coolant; wherein the first surface of the heat dissipation base is connected to the plurality of high-thermal-conductivity fins; wherein the at least one high-porosity solid structure is located at the first surface of the heat dissipation base, and the at least one high-porosity solid structure is alternately arranged and connected between side walls of any two adjacent ones of the plurality of high-thermal-conductivity fins; wherein the at least one high-porosity solid structure includes a plurality of closed holes and a plurality of open holes; wherein a predetermined volume ratio of the at least one high-porosity solid structure to the high-thermal-conductivity fins is higher than 0.25.

2. The two-phase immersion-cooling heat-dissipation composite structure according to claim 1, wherein the high-thermal-conductivity fins are made of copper, copper alloy, aluminum, or aluminum alloy.

3. The two-phase immersion-cooling heat-dissipation composite structure according to claim 1, wherein the high-thermal-conductivity fins are formed by bending, forging, extrusion, or powder sintering.

4. The two-phase immersion-cooling heat-dissipation composite structure according to claim 1, wherein the high-thermal-conductivity fins are pin-fins or plate fins, and the thermal conductivity of the high-thermal-conductivity fins is greater than 300 W/m·K.

5. The two-phase immersion-cooling heat-dissipation composite structure according to claim 1, wherein the predetermined volume ratio of the at least one high-porosity solid structure to the high-thermal-conductivity fins is between 0.25 and 2.25.

6. The two-phase immersion-cooling heat-dissipation composite structure according to claim 1, wherein the porosity of the at least one high-porosity solid structure is higher than the porosity of the high-thermal-conductivity fins, and the porosity of the at least one high-porosity solid structure is higher than 20% and less than 70%.

7. The two-phase immersion-cooling heat-dissipation composite structure according to claim 1, wherein the height of the at least one high-porosity solid structure is higher than 1 mm, and the height of the at least one high-porosity solid structure is between 10% and 150% of the height of the high-thermal-conductivity fins.

8. The two-phase immersion-cooling heat-dissipation composite structure according to claim 1, wherein the at least one high-porosity solid structure is formed by metal powder sintering, and a metal powder for forming the at least one high-porosity solid structure has a median diameter between 30 μm and 800 μm.

9. The two-phase immersion-cooling heat-dissipation composite structure according to claim 1, wherein the at least one high-porosity solid structure is formed by chemically etching a substrate with a chemical agent of phosphoric acid microetching solution, sulfate microetching solution, or ferric chloride etching solution.

10. The two-phase immersion-cooling heat-dissipation composite structure according to claim 1, wherein the at least one high-porosity solid structure is made of a substrate of copper, copper alloy, aluminum alloy, graphite, or silver.

* * * * *